United States Patent
Ryu

(10) Patent No.: US 7,745,896 B2
(45) Date of Patent: Jun. 29, 2010

(54) IMAGE SENSOR AND METHOD OF MANUFACTURING THE SAME

(75) Inventor: Sang Wook Ryu, Cheongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 104 days.

(21) Appl. No.: 12/122,434

(22) Filed: May 16, 2008

(65) Prior Publication Data

US 2008/0283950 A1 Nov. 20, 2008

(30) Foreign Application Priority Data

May 17, 2007 (KR) .................. 10-2007-0047888

(51) Int. Cl.
*H01L 31/0232* (2006.01)
*H01L 31/18* (2006.01)

(52) U.S. Cl. ............... 257/432; 257/431; 257/E31.127; 257/E31.001; 257/E21.001; 257/E21.158; 438/70; 438/73; 438/96

(58) Field of Classification Search ......... 257/288–294, 257/257, 258, 432, 222–233, E31.079, E31.001, 257/E31.073, E21.158; 438/69, 73, 461, 438/462, 59, 82, 98
See application file for complete search history.

(56) References Cited

U.S. PATENT DOCUMENTS

| 2006/0267054 A1 | 11/2006 | Martin et al. |
| 2008/0079102 A1* | 4/2008 | Chen et al. .................. 257/431 |
| 2008/0224243 A1* | 9/2008 | Lee ........................... 257/432 |

FOREIGN PATENT DOCUMENTS

JP 2006-253422 A 9/2006

* cited by examiner

*Primary Examiner*—Victor A Mandala
*Assistant Examiner*—Whitney Moore
(74) *Attorney, Agent, or Firm*—Saliwanchik, Lloyd & Saliwanchik

(57) ABSTRACT

An image sensor and method for manufacturing the same are provided. The image sensor can include a semiconductor substrate, a metal interconnection layer, a light-receiving unit, a lens-type upper electrode, and a color filter. The semiconductor substrate can include a circuit region. The metal interconnection layer can include a metal interconnection and an interlayer dielectric. The light-receiving unit can be a photodiode disposed on the metal interconnection layer. The lens-type upper electrode can be disposed on the light-receiving unit and formed in a convex lens shape. The color filter can be disposed on the lens-type upper electrode.

16 Claims, 5 Drawing Sheets

IMAGE SENSOR AND METHOD OF MANUFACTURING THE SAME

CROSS-REFERENCE TO RELATED APPLICATION

The present application claims the benefit under 35 U.S.C. §119 of Korean Patent Application No. 10-2007-0047888, filed May 17, 2007, which is hereby incorporated by reference in its entirety.

BACKGROUND

An image sensor is a semiconductor device for converting an optical image into an electrical signal. An image sensor can generally be classified as a charge coupled device (CCD) image sensor or a complementary metal oxide semiconductor (CMOS) image sensor (CIS).

A CIS includes a photodiode and a metal oxide silicon (MOS) transistor for each unit pixel, and sequentially detects an electrical signal of the unit pixel in a switching manner to generate an image.

Typically, the CIS includes a photodiode region for converting a light signal into an electrical signal and a transistor for processing the electric signal where the photodiode and transistor are horizontally arranged on a semiconductor substrate.

The photodiode of the horizontal type CIS is horizontally adjacent to the transistor on the substrate. Therefore, an additional area of the substrate for each pixel is required for forming the photodiode region.

BRIEF SUMMARY

Embodiments of the present invention provide an image sensor including a transistor circuit and a photodiode, which are vertically stacked, and a method of manufacturing the image sensor.

In one embodiment, an image sensor can include: a semiconductor substrate having a transistor circuit formed thereon; a metal interconnection layer including a metal interconnection and an interlayer dielectric on the semiconductor substrate and connected to the transistor circuit; a light-receiving unit on the metal interconnection layer; a lens-type upper electrode on the light-receiving unit, the upper electrode being formed in a convex lens shape; and a color filter on the lens-type upper electrode.

A method of manufacturing an image sensor according to an embodiment includes: forming a transistor circuit on a semiconductor substrate; forming a metal interconnection layer including metal interconnections and an interlayer dielectric, on the semiconductor substrate; forming a light-receiving unit on the metal interconnection layer; forming a lens-type upper electrode on the light-receiving unit, the upper electrode being formed in a convex lens shape; and forming a color filter on the lens-type upper electrode.

The details of one or more embodiments are set forth in the accompanying drawings and the description below. Other features will be apparent from the description and drawings, and from the claims.

DETAILED DESCRIPTION

Reference will now be made in detail to embodiments of the present disclosure, examples of which are illustrated in the accompanying drawings.

Figure 8:
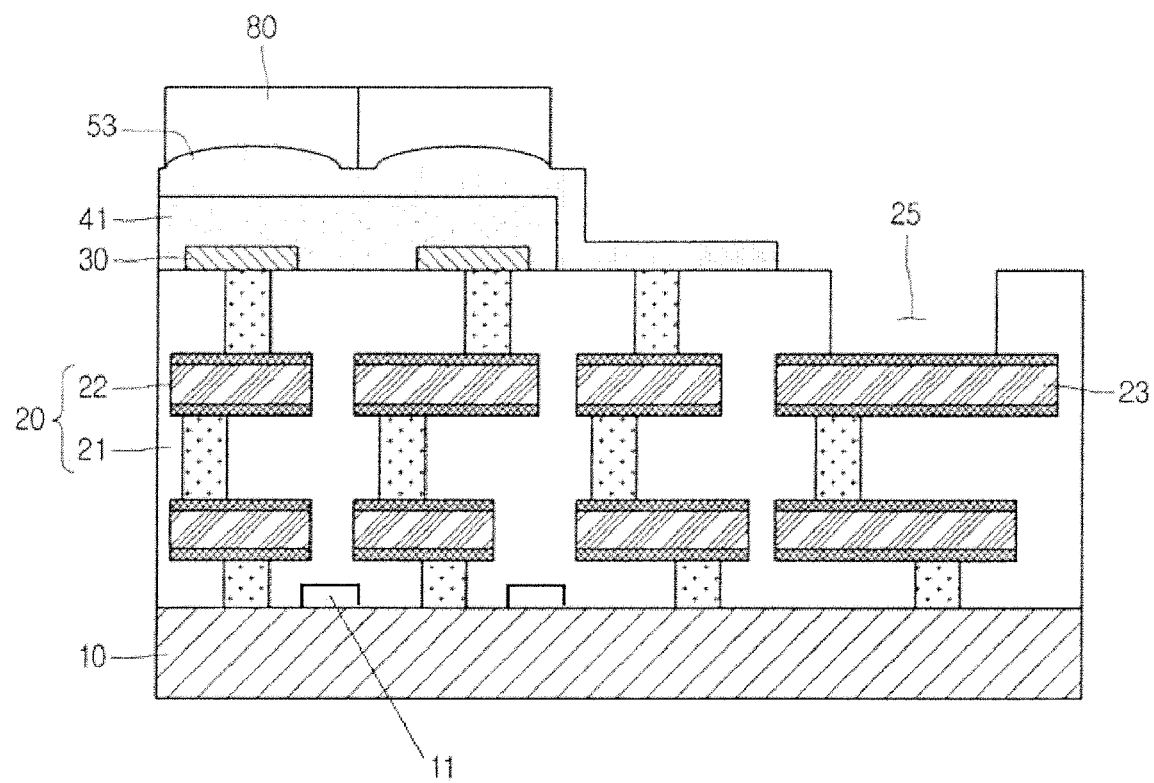

Referring to FIG. 8, an image sensor according to an embodiment can include a semiconductor substrate 10, a metal interconnection layer 20, a photodiode 41, a convex lens-type upper electrode 53, and color filters 80. The semiconductor substrate 10 can include a CMOS circuit 11. The metal interconnection layer 20 can include metal interconnections 22 and interlayer dielectrics 21, which are disposed on the semiconductor substrate 10. The metal interconnections 22 can be used to connect signal and power lines to the CMOS circuit. The photodiode 41 (light-receiving unit) can be disposed on the metal interconnection layer 20. The convex lens-type upper electrode 53 is disposed on the photodiode 41. The color filters 80 can be disposed on the lens-type upper electrode 53.

Figure 9:
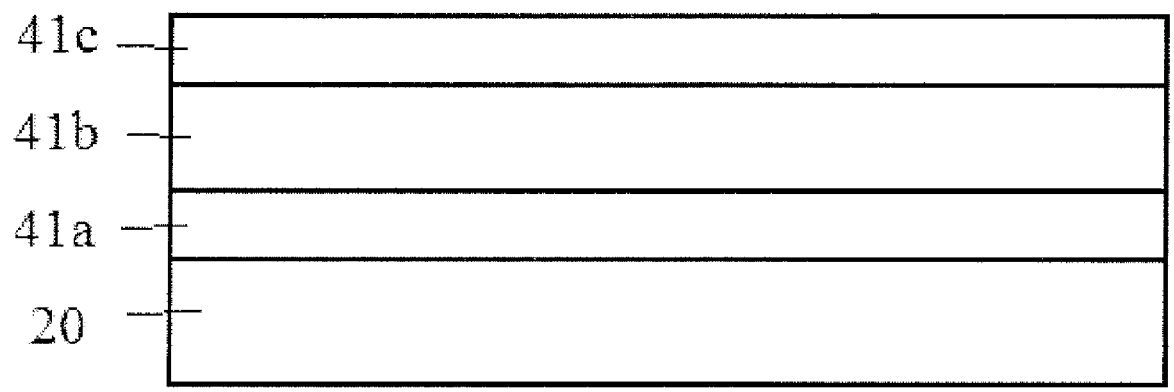
FIG. 9 is a cross-sectional view illustrating a photodiode structure according to one embodiment of the present invention.

In one embodiment, the photodiode 41 can include a first conduction type conducting layer 41a disposed on the metal interconnection layer 20, an intrinsic layer 41b disposed on the first conduction type conducting layer 41a, and a second conduction type conducting layer 41c disposed on the intrinsic layer 41b such as shown in FIG. 9.

In another embodiment, the photodiode 41 can include an intrinsic layer disposed on the metal interconnection layer 20 and the second conduction type conducting layer disposed on the intrinsic layer.

In addition, an optional lower electrode 30 can be disposed over the metal interconnections 22 between the photodiode 41 and the metal interconnection layer 20.

The lens-type upper electrode 53 can include a transparent electrode. For example, the lens-type upper electrode 53 can be formed of indium tin oxide (ITO) or cadmium tin oxide (CTO). In one embodiment, the upper electrode 53 can have a thickness ranging from approximately 500 Å to approximately 10,000 Å.

As described above, a convex lens-type upper electrode can be disposed in each unit pixel on the photodiode, thus improving a light collection efficiency of incident light. Because the upper electrode has a convex shape, a microlens is not required, thus reducing the number of manufacturing processes and costs.

FIGS. 1 to 8 are cross-sectional views illustrating a process of manufacturing an image sensor according to an embodiment.

Figure 1:
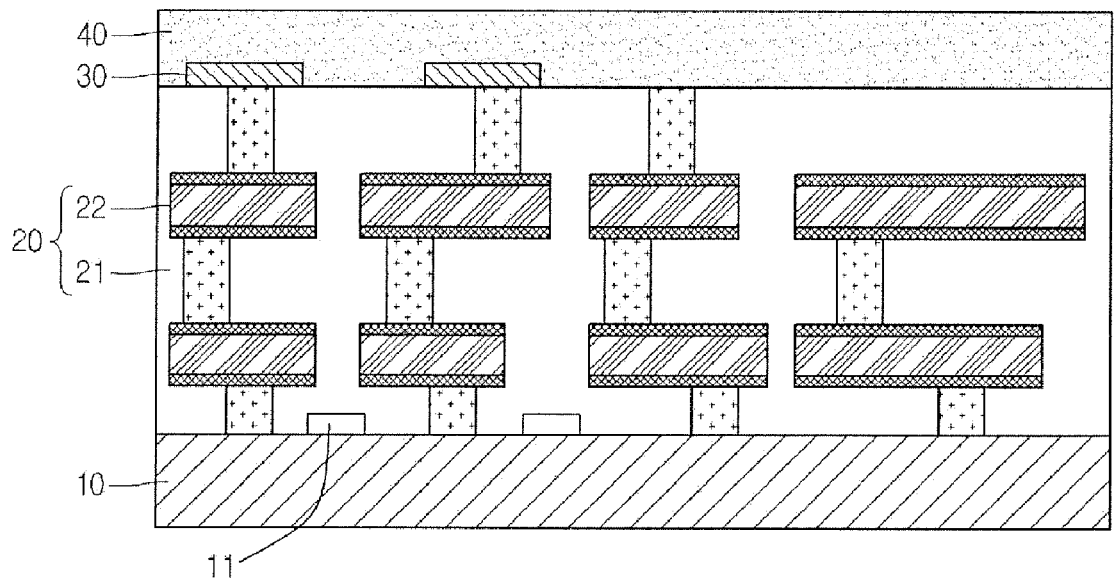
FIGS. 1 to 8 are cross-sectional views illustrating a process of manufacturing an image sensor according to an embodiment of the present invention.

Referring to FIG. 1, a metal interconnection layer 20, including metal interconnections 22 and interlayer dielectrics 21, can be formed on a semiconductor substrate 10 having a CMOS circuit (not shown).

Although not shown, a device isolation layer defining an active region and a field region can be provided on the semiconductor substrate 10. To form a unit pixel, a CMOS circuit 11, such as for a 4T-type image sensor, including a transfer transistor, a reset transistor, a drive transistor, and a select transistor can be formed on the semiconductor substrate 10. The transfer transistor will be connected to the photodiode and allow received photo charge to be converted into an electric signal.

The metal interconnection layer 20 can be formed on the CMOS circuit 11 to provide interconnections. The metal interconnection layer 20 can include a plurality of layers to connect the circuit region to a power line or a signal line. Although the figures show two metal line layers, embodiments are not limited thereto. For example, one metal line layer can be used, or three or more metal line layers can be used.

The metal interconnection layer 20 can include a plurality of interlayer dielectrics 21 on the semiconductor substrate 10 and metal interconnections 22 disposed between the interlayer dielectrics 21. The metal interconnection layer 20 can be formed using any suitable method known in the art.

The metal interconnections 22 can be disposed on each unit pixel such that the CMOS circuit is connected to the photodiode. The metal interconnections can be patterned to correspond to each unit pixel.

The metal interconnections 22 can be formed of various conductive materials including a metal, an alloy, or a silicide. For example, the metal interconnections 22 can be formed of a metal including, but not limited to, aluminum, copper, cobalt, and tungsten.

A pad 23 can also be formed when forming the interlayer dielectrics 21 and metal interconnections 22.

Accordingly, a photodiode 41 can be formed on the metal interconnection layer 20 such that the photodiode 41 is electrically connected to a metal interconnection.

In certain embodiment, before the photodiode 41 is formed, a lower electrode 30 can be formed on the metal interconnection 22. The lower electrode 30 can be formed of, for example, a metal including any one of Cr, Ti, TiW and Ta. It will be appreciated that the lower electrode 30 may be omitted.

In one embodiment, to form the photodiode 41, a photodiode layer 40 can be formed on the metal interconnection layer 20. According to certain embodiments, a PIN diode can be used.

A PIN diode is a diode formed using, for example, an intrinsic amorphous silicon between an n-type amorphous silicon layer and a p-type amorphous silicon layer. The performance of a photodiode depends on its efficiency in converting incident light into an electrical output and a total charge capacitance. Electric charges in the related art horizontal photodiode are generated and stored in a depletion region generated by a heterojunction such as a P-N, N-P, N-P-N, or P-N-P junction. In contrast, the entire region of the intrinsic amorphous silicon of the PIN diode formed between an n-type region and a p-type region provides a depletion region. Therefore, electric charges are advantageously stored and generated.

As such, according to many embodiments, a PIN diode can be used as the photodiode. The PIN diode according to certain embodiments of the present invention can have a structure such as a P-I-N, N-I-P, or I-P. Furthermore, a metal electrode can be used in place of, or in addition to, the n-type layer of the PIN diode. In one embodiment having the P-I-N structure, the first conduction type conducting layer can be formed of n-type amorphous silicon, the intrinsic layer can be formed of intrinsic amorphous silicon, and the second conduction type conducting layer can be formed of p-type amorphous silicon.

Although not shown, a method of forming the photodiode using a PIN diode structure will now be described.

For example, a first conduction type conducting layer can formed on the metal interconnection layer 20.

The first conduction type conducting layer can serve as an N-layer of the PIN diode. That is, the first conduction type conducting layer can be an N-type conduction type conducting layer, but embodiments are not limited thereto.

The first conduction type conducting layer can be formed of an n-doped amorphous silicon.

That is, the first conduction type conducting layer can be provided in the form of a-Si:H, a-SiGe:H, a-SiC, a-SiN:H or a-SiO:H by adding germanium, carbon, nitrogen, or oxygen to an amorphous silicon.

In one embodiment, the first conduction type conducting layer can be formed using a chemical vapor deposition (CVD) process, such as plasma enhanced chemical vapor deposition (PECVD). For example, the first conduction type conducting layer can be formed using PECVD by mixing a silane gas ($SiH_4$) with $PH_3$ or $P_2H_5$.

Then, an intrinsic layer can be formed on the first conduction type conducting layer. The intrinsic layer can serve as an I-layer of the PIN diode.

The intrinsic layer can be formed of intrinsic amorphous silicon.

The intrinsic layer can have a thickness approximately 10 to 1,000 times greater than that of the first conduction type conducting layer. As the thickness of the intrinsic layer increases, the depletion region of the PIN diode increases. Accordingly, a great amount of photocharges can be advantageously generated and stored.

A second conduction type conducting layer can be formed on the intrinsic layer.

The second conduction type conducting layer can serve as the P-layer of the PIN diode. That is, the second conduction type conducting layer can be a p-type conduction type conducting layer, but embodiments are not limited thereto.

The second conduction type conducting layer can be formed of a p-doped amorphous silicon.

As described above, the photodiode layer 40 including, for example, the first conduction type conducting layer, the intrinsic layer, and the second conduction type conducting layer, can be formed on the semiconductor substrate 10 on the metal interconnection layer 20, so that the CMOS circuit and the photodiode layer 40 are vertically stacked, thus improving the fill factor of an image sensor.

Although the above exemplary embodiment describes the photodiode layer 40 having the first conduction type conducting layer, the intrinsic layer, and the second conduction type conducting layer, the photodiode layer can be formed with another structure.

Because the CMOS circuit and the photodiode are vertically stacked a greater sensitivity than that of a related art image sensor can be provided for the same sized pixel.

Also, the CMOS circuit can be embodied as a more complicated circuit without reducing the sensitivity of each unit pixel.

Figure 2:
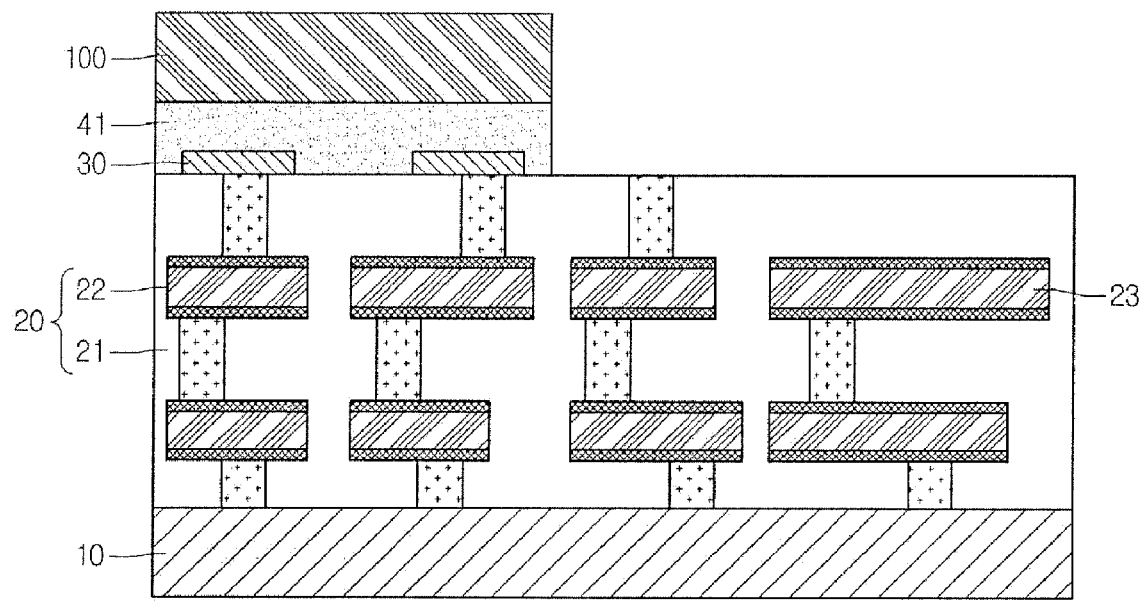

Referring to FIG. 2, a photoresist can be coated on the photodiode layer 40 and patterned to expose the photodiode layer 40 on the regions other than a pixel region (such as a pad region).

Then, the photodiode layer 40 can be etched using the pixel mask 100 as an etch mask. Thus, the portion of the photodiode layer 40 not of the pixel region is removed, so that the photodiode 41 is disposed on only the pixel region.

In one embodiment, the photodiode 41 can be formed by etching the photodiode layer 40 exposed by the pixel mask 100 using an etching gas including halogen elements, such as Cl, Br, and F.

Figure 3:
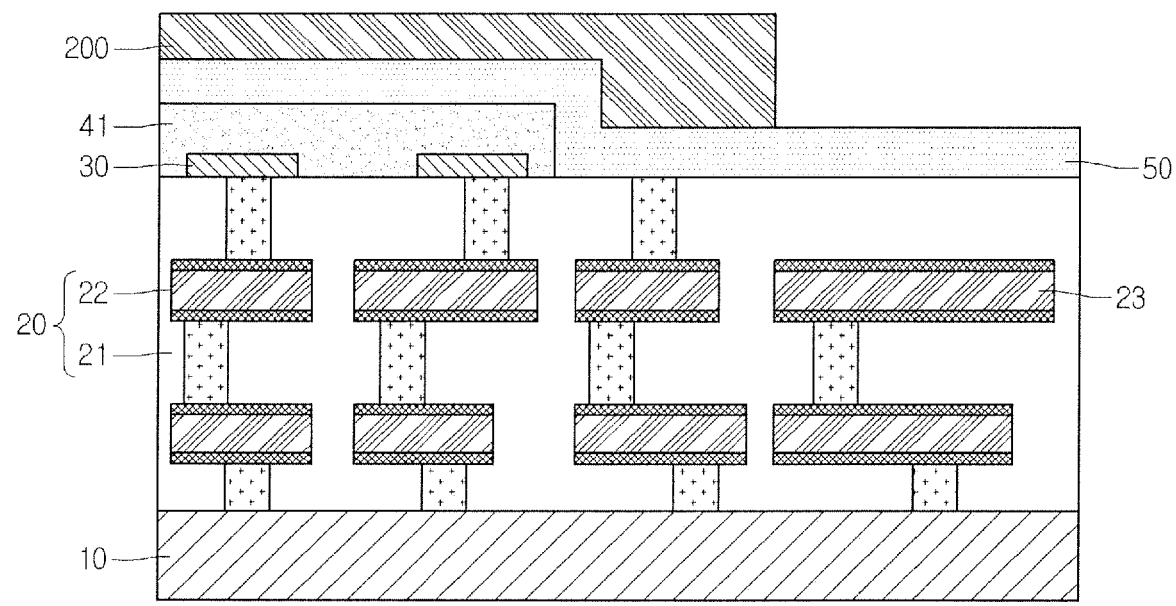

Referring to FIG. 3, the pixel mask 100 can be removed, and then an upper electrode layer 50 can be formed on the semiconductor substrate 10 including the photodiode 41.

The upper electrode layer 50 can be formed as a transparent electrode with excellent light transmittance and high conductivity. For example, the upper electrode layer 50 can be formed of indium tin oxide (ITO) or cadmium tin oxide (CTO). In an embodiment, the upper electrode layer 50 can have a thickness ranging from approximately 500 Å to approximately 10,000 Å. According to an embodiment, the upper electrode layer 50 can have an electric conductivity greater than $10^{-3}$/Ohm.m.

A first pad mask 200 can be formed on the upper electrode layer 50 to expose a surface of the upper electrode layer 50 corresponding to the region for the pad 23.

The first pad mask 200 can be formed by applying a photoresist to the upper electrode layer 50 and patterning the photoresist.

The upper electrode layer 50 can be etched using the first pad mask 200 as an etch mask to remove a portion of the upper electrode layer 50 corresponding to the region for the pad 23. Thus, a portion of the metal interconnection layer 20 corresponding to the pad 23 is exposed, and the upper electrode 51 is formed from the upper electrode layer 50 on the pixel region.

Figure 4:
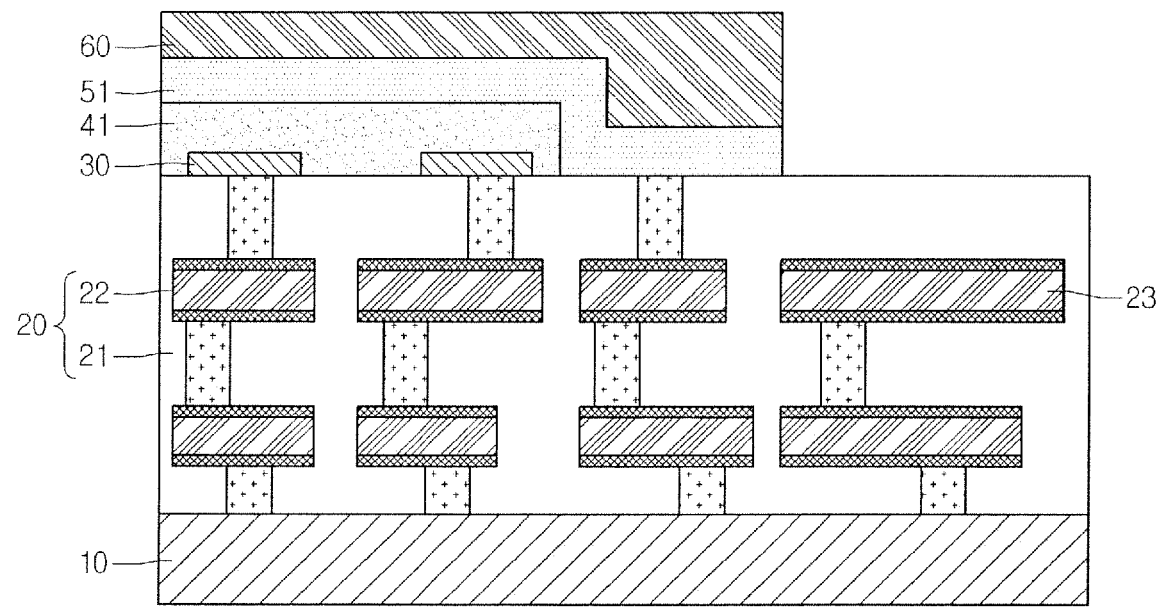

Referring to FIG. 4, the first pad mask 200 can be removed, and then a photoresist pattern 60 can be formed to form a microlens mask on the upper electrode 51.

The photoresist pattern 60 can be formed by applying a photoresist through a spin process, and then performing photo and developing process to cover the upper electrode 51 and expose the surface of the interlayer dielectric 21 corresponding to the pad 23.

Figure 5:
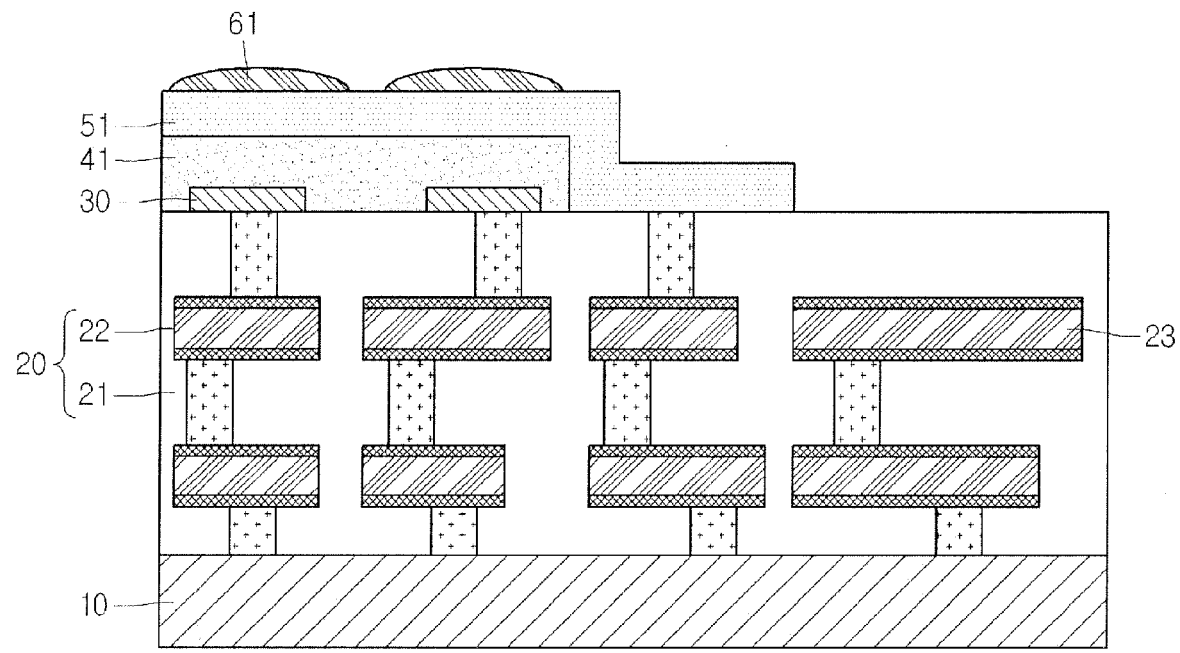

Referring to FIG. 5, a microlens mask 61 corresponding to each unit pixel can be formed by patterning the photoresist pattern 60 disposed on the upper electrode 51 into portions each corresponding to each unit pixel and performing a reflow process to shape the portions of the patterned photoresist 60 into a dome shape.

Figure 6:
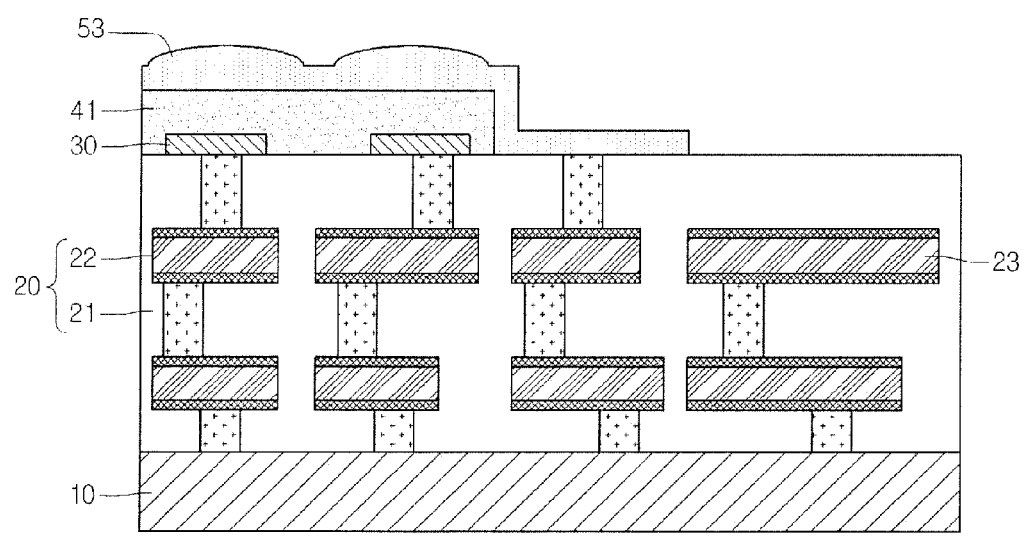

Referring to FIG. 6, the lens-type upper electrode 53 can be formed.

According to an embodiment, the lens-type upper electrode 53 can be formed by performing an etching process on the upper electrode 51 using the microlens mask 61 as an etch mask.

The lens-type upper electrode 53 can be formed by performing an etching process with an etch ratio of 1:1 between the upper electrode 51 and the microlens mask 61, thus the lens-type upper electrode 53 is formed in a convex lens type following the shape of the microlens mask 61.

In one embodiment, to form the lens-type upper electrode 53, an etching process can be performed in a chamber with an etching gas of $C_xH_yF_z$ (where x, y, and z are 0 or natural numbers). The etching can optionally include an inert gas such as Ar, He, $O_2$, or $N_2$ mixed with the etching gas.

As described above, the lens-type upper electrode 53 is provided on the photodiode 41 by each unit pixel, thus improving a light collection efficiency of incident light. Also, a related art microlens is not required, thus reducing the number of manufacturing processes and costs.

Figure 7:
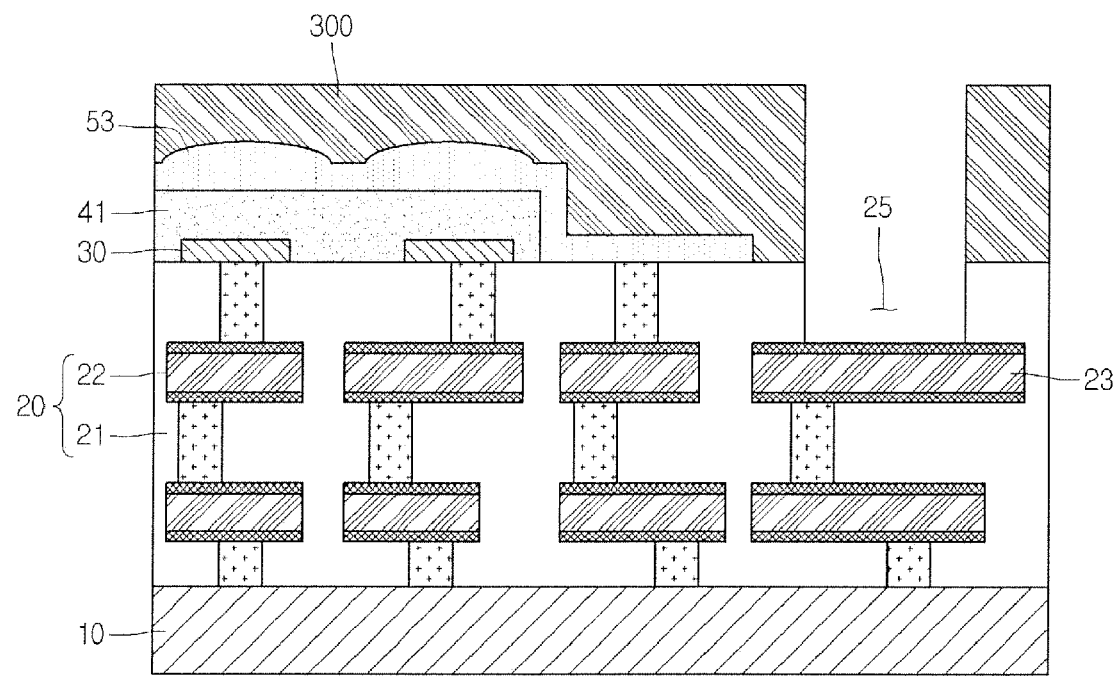

Referring to FIG. 7, a second pad mask 300 for exposing the pad 23 can be formed on the semiconductor substrate 10 with the lens-type upper electrode 53.

The second pad mask 300 can be formed by applying a photoresist on the metal interconnection layer 20 with the lens-type upper electrode 53, and patterning the photoresist. As a result, a surface of the metal interconnection layer 20 corresponding to the pad 23 is exposed, but the other region is covered by the second pad mask 300.

Then, the interlayer dielectric 21 can be removed using a dry etching process and the second pad mask 300 as an etch mask to expose the pad 23 through a pad hole 25. In one embodiment, the etching process for the lens-type upper electrode 53 can be used as a process of exposing the pad 23.

That is, the pad 23 can be exposed by performing an etching process on the interlayer dielectric 21 with an etching gas of $C_xH_yF_z$ (where x, y, and z are 0 or natural numbers). Optionally, the etching can include an inert gas such as Ar, He, $O_2$, and $N_2$ mixed with the etching gas.

Referring to FIG. 8, color filters 80 can be formed on the lens-type upper electrode 53.

The color filters 80, each corresponding to a unit pixel, can be formed using dyeable resist. The color filters 80 extract their color from incident light.

The image sensor and the method of manufacturing thereof according to embodiments can vertically stack the transistor circuit and the photodiode.

Accordingly, the fill factor can be close to 100% by vertically stacking the transistor circuit and the photodiode.

By utilizing a vertical arrangement, a greater sensitivity than that of a related art horizontal image sensor can be provided for the same sized pixel.

Also, each unit pixel according to embodiments can include more complicated circuits without reducing sensitivity.

According to embodiments, the upper electrode can be formed having a convex lens shape on the photodiode, thus improving a light collection efficiency of incident light.

Also, according to embodiments, an additional process of forming a microlens is not required, which may reduce the number of manufacturing processes and costs.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor, comprising:
    a semiconductor substrate having a complementary metal oxide semiconductor (CMOS) circuit formed thereon;
    a metal interconnection layer including a metal interconnection and an interlayer dielectric on the semiconductor substrate including the CMOS circuit;
    a light-receiving unit on the metal interconnection layer; and
    an upper electrode on the light-receiving unit, the upper electrode being formed having a convex lens shape.

2. The image sensor according to claim 1, wherein the light-receiving unit comprises:
    a first conduction type conducting layer on the metal interconnection layer;

an intrinsic layer on the first conduction type conducting layer; and a second conduction type conducting layer on the intrinsic layer.

3. The image sensor according to claim 1, wherein the light-receiving unit comprises:

an intrinsic layer on the metal interconnection layer; and a second conduction type conducting layer on the intrinsic layer.

4. The image sensor according to claim 1, further comprising a lower electrode on the metal interconnection below the light receiving unit.

5. The image sensor according to claim 1, wherein the lens-type upper electrode comprises a transparent electrode.

6. The image sensor according to claim 1, further comprising a color filter on the upper electrode.

7. A method of manufacturing an image sensor, comprising:

forming a complementary metal oxide semiconductor (CMOS) circuit on a semiconductor substrate;

forming a metal interconnection layer including metal interconnections and an interlayer dielectric on the semiconductor substrate, the metal interconnections providing connections for the CMOS circuit;

forming a light-receiving unit on the metal interconnection layer; and forming a lens-type upper electrode on the light-receiving unit.

8. The method according to claim 7, wherein the forming of the lens-type upper electrode comprises:

depositing an electrode material on the light-receiving unit to form an upper electrode layer;

forming a microlens mask on the upper electrode layer; and etching the upper electrode layer using the microlens mask as an etch mask.

9. The method according to claim 8, wherein forming the microlens mask comprises:

applying a photoresist to the semiconductor substrate;

patterning the photoresist; and performing a reflow process to the patterned photoresist.

10. The method according to claim 8, wherein an etching rate between the upper electrode layer and the microlens mask is about 1:1.

11. The method according to claim 8, wherein the etching of the upper electrode layer comprises using an etching gas of $C_xH_yF_z$ (where x, y, and z are 0 or a natural number) mixed with at least one of $O_2$, $N_2$, Ar, and He.

12. The method according to claim 7, wherein the lens-type upper electrode comprises a transparent electrode.

13. The method according to claim 6, further comprising:

forming a pad mask on the semiconductor substrate including the lens-type upper electrode; and exposing a pad metal interconnection of the metal interconnection layer by performing an etching process using the pad mask as an etch mask.

14. The method according to claim 13, wherein the exposing of the pad metal connection comprises using an etching gas of $C_xH_yF_z$ (where x, y, and z are 0 or a natural number) mixed with at least one of $O_2$, $N_2$, and Ar.

15. The method according to claim 13, further comprising forming a color filter on the lens-type upper electrode after exposing the pad metal interconnection.

16. The method according to claim 7, further comprising forming a color filter on the lens-type upper electrode.

* * * * *